(12) United States Patent
Imamura et al.

(10) Patent No.: US 12,311,417 B2
(45) Date of Patent: May 27, 2025

(54) METHOD AND SYSTEM FOR PRODUCING FLUORORESIN MOLDED ARTICLE

(71) Applicant: DAIKIN INDUSTRIES, LTD., Osaka (JP)

(72) Inventors: Hitoshi Imamura, Osaka (JP); Eri Mukai, Osaka (JP); Masahiro Kondo, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/296,775

(22) PCT Filed: Nov. 26, 2019

(86) PCT No.: PCT/JP2019/046187
§ 371 (c)(1),
(2) Date: May 25, 2021

(87) PCT Pub. No.: WO2020/111066
PCT Pub. Date: Jun. 4, 2020

(65) Prior Publication Data
US 2022/0088648 A1  Mar. 24, 2022

(30) Foreign Application Priority Data

Nov. 27, 2018  (JP) .................. 2018-220928

(51) Int. Cl.
*B08B 9/032* (2006.01)
*B08B 3/04* (2006.01)
(Continued)

(52) U.S. Cl.
CPC .............. *B08B 9/032* (2013.01); *B08B 3/04* (2013.01); *C08F 214/262* (2013.01); *C08K 5/05* (2013.01);
(Continued)

(58) Field of Classification Search
CPC . B08B 3/04; B08B 2209/032; B08B 2240/00; B08B 9/032; C08F 214/262; C08K 5/05
See application file for complete search history.

(56) References Cited

U.S. PATENT DOCUMENTS 4,430,283 A * 2/1984 Burnett ................. B29C 48/475
                                                   264/330
4,904,553 A   2/1990 Nakajima et al.
(Continued)

FOREIGN PATENT DOCUMENTS

EP   0420141 A2 * 4/1991 ................ C08J 7/00
EP   1939223 A1 * 7/2008 .............. C08F 14/18
(Continued)

OTHER PUBLICATIONS

Chemical Book: 26655-00-5 (Polytetrafluoroethylene-co-perfluoro(alkyl vinyl ether) Product Description (Year: 2017).*
(Continued)

*Primary Examiner* — Sharidan Carrillo
(74) *Attorney, Agent, or Firm* — Sughrue Mion, PLLC

(57) ABSTRACT

A method for producing a tube for a chemical solution pipe composed of a cleaned fluororesin molded article, the method including cleaning a tube-shaped fluororesin molded article with a chemical solution; and cleaning the tube-shaped fluororesin molded article with water. The cleaning with water is performed after the cleaning with a chemical solution, and the chemical solution is an alcohol or an aqueous alcohol solution.

4 Claims, 2 Drawing Sheets

(51) Int. Cl.
    *C08F 214/26*     (2006.01)
    *C08K 5/05*     (2006.01)

(52) U.S. Cl.
    CPC ..... *B08B 2209/032* (2013.01); *B08B 2240/00* (2013.01)

(56) References Cited

U.S. PATENT DOCUMENTS

| | | | |
|---|---|---|---|
| 4,906,538 | A | 3/1990 | Toyosawa et al. |
| 5,064,474 | A | 11/1991 | Aomi et al. |
| 6,663,722 | B1 * | 12/2003 | Higashino ................. B08B 3/04 134/28 |
| 2006/0027571 | A1 | 2/2006 | Miyoshi et al. |
| 2006/0169624 | A1 * | 8/2006 | Radomyselski .......... D06L 1/10 210/96.1 |
| 2007/0240740 | A1 * | 10/2007 | McDermott .......... B08B 7/0021 257/E21.255 |
| 2013/0319468 | A1 * | 12/2013 | Yanagawa ................ C23G 3/00 134/105 |
| 2019/0056048 | A1 * | 2/2019 | Kuwajima .............. B32B 27/32 |
| 2019/0202151 | A1 * | 7/2019 | Imamura .............. B29D 23/001 |
| 2021/0269568 | A1 * | 9/2021 | Imamura .............. B29C 48/022 |

FOREIGN PATENT DOCUMENTS

| | | | | |
|---|---|---|---|---|
| JP | 63-258936 | A | | 10/1988 |
| JP | 03-112632 | A | | 5/1991 |
| JP | 04-175350 | A | | 6/1992 |
| JP | 07-157514 | A | | 6/1995 |
| JP | 10-195212 | A | | 7/1998 |
| JP | 2006-071262 | A | | 3/2006 |
| JP | 2015-040279 | A | | 3/2015 |
| JP | 2017019263 | A | * 1/2017 | ........... B29C 48/022 |
| JP | 2018-022056 | A | | 2/2018 |
| WO | WO-0192356 | A2 | * 12/2001 | ............. C08F 14/26 |
| WO | WO-2018034238 | A1 | * 2/2018 | ............. B29C 35/08 |
| WO | WO-2020004083 | A1 | * 1/2020 | ........... B29C 48/022 |

OTHER PUBLICATIONS

International Search Report for PCT/JP2019/046187 dated Feb. 18, 2020 [PCT/ISA/210].

International Preliminary Report on Patentability with the translation of Written Opinion dated May 25, 2021 from the International Bureau in International Application No. PCT/JP2019/046187.

* cited by examiner

METHOD AND SYSTEM FOR PRODUCING FLUORORESIN MOLDED ARTICLE

CROSS REFERENCE TO RELATED APPLICATIONS

This application is a National Stage of Application No. PCT/JP2019/046187 filed Nov. 26, 2019, claiming priority based on Japanese Patent Application No. 2018-220928 filed Nov. 27, 2018.

TECHNICAL FIELD

The present disclosure relates to a method and a system for producing a fluororesin molded article.

BACKGROUND ART

Patent Document 1 proposes a cleaning method for removing particles adhered to a surface of a fluororesin molded article used in a semiconductor manufacturing apparatus, wherein the cleaning is performed using a cleaning agent containing a fluorinated solvent.

RELATED ART

Patent Documents

Patent Document 1: Japanese Patent Laid-Open No. 2015-40279

SUMMARY OF THE INVENTION

Problem to be Solved by the Invention

Fluororesin molded articles are used as, for example, tubes for transferring chemical solutions used for producing semiconductor devices. With the recent miniaturization of semiconductor devices, there is a need for a technique of reducing the number of particles generated from such a fluororesin molded article to a level lower than ever before.

The present disclosure aims to provide a method and a system for producing a fluororesin molded article that is less likely to generate particles.

Means for Solving the Problem

According to the present disclosure, there is provided a method for producing a cleaned fluororesin molded article, the method including cleaning a fluororesin molded article with a chemical solution; and cleaning the fluororesin molded article with water.

In the method of the present disclosure, the chemical solution is preferably an alcohol or aqueous alcohol solution.

In the method of the present disclosure, the chemical solution is more preferably an alcohol or an aqueous alcohol solution having an alcohol concentration of 20 to 100% by mass.

In the method of the present disclosure, the chemical solution is preferably an alkaline aqueous solution at pH 8 or more.

In the method of the present disclosure, the chemical solution is preferably an aqueous ammonia solution.

In the method of the present disclosure, the cleaning with a chemical solution is preferably liquid-flow cleaning.

In the method of the present disclosure, the cleaning with water is preferably water-flow cleaning.

In the method of the present disclosure, the fluororesin molded article preferably contains a tetrafluoroethylene/perfluoro (alkyl vinyl ether) copolymer as a fluororesin.

In the method of the present disclosure, the fluororesin molded article is preferably a tube.

The method of the present disclosure preferably further includes removing particles from the chemical solution used in the cleaning; and reusing the chemical solution from which the particles have been removed as at least part of the chemical solution to be used in the cleaning with a chemical solution.

The method of the present disclosure preferably further includes removing particles from the water used in the cleaning; and reusing the water from which the particles have been removed as at least part of the water to be used in the cleaning with water.

According to the present disclosure, there is also provided a system for producing a cleaned fluororesin molded article, the system including a first filter that removes particles from a chemical solution; a second filter that removes particles from water; a cleaner for a fluororesin molded article to which the chemical solution is supplied from the first filter, or the water is supplied from the second filter; a switching equipment that switches between the supply of the chemical solution from the first filter to the cleaner, and the supply of the water from the second filter to the cleaner; a first returning device that returns the chemical solution used in the cleaning from the cleaner to the first filter; and a second returning device that returns the water used in the cleaning from the cleaner to the second filter.

Effects of Invention

According to the present disclosure, a method and a system for producing a fluororesin molded article that is less likely to generate particles can be provided.

DESCRIPTION OF EMBODIMENTS

Figure 1:
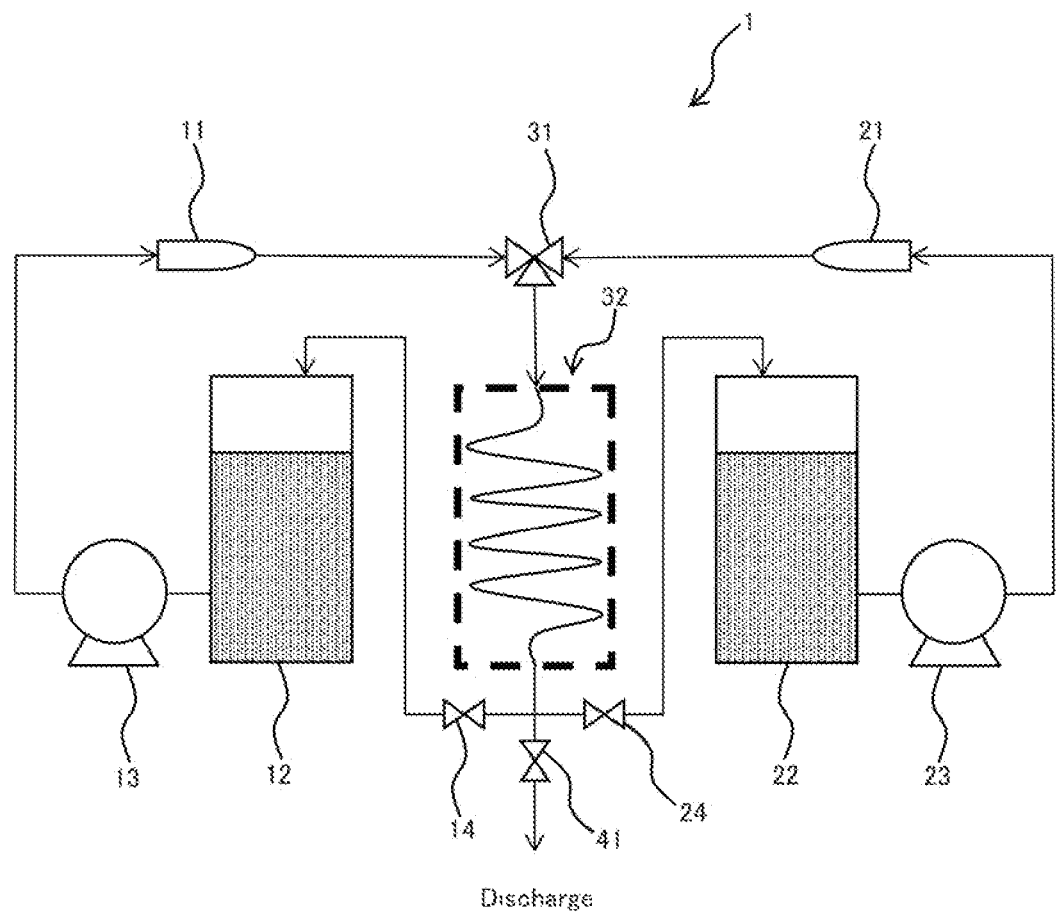
FIG. 1 is a schematic diagram showing one exemplary embodiment of a system of the present disclosure.

Specific embodiments of the present disclosure will be hereinafter described in detail, although the present disclosure is not limited to the following embodiments.

In a semiconductor manufacturing process, large amounts of fluororesin molded articles, such as pipes, tubes, joints, valves, bottles, rectangular tanks, and baskets for silicon wafers, are used in important sections that directly affect the quality of semiconductor products. As the need for further miniaturization has recently increased sharply, it is required to reduce the generation of particles from such a fluororesin molded article, which easily affects the performance of miniaturized patterns.

One possible method for reducing the generation of particles from a fluororesin molded article is to use a fluororesin material in which the amount of particle-causing substances has been reduced, as a raw material of the molded article. As such a fluororesin material, for example, a fluororesin material containing a reduced amount of volatile low-molecular-weight substances has been proposed.

However, even when an appropriate raw material is selected, the generation of particles may not be sufficiently prevented. For example, when a fluororesin material is subjected to primary processing and then secondary processing such as bending or butt welding, the fluororesin material is heated to a temperature above the melting point and melted more than once, until molding is completed. This heating may cause the formation of new volatile low-molecular-weight substances, which may adhere to the surface of the fluororesin molded article. Moreover, performing secondary processing inevitably increases the molding time, and causes particles derived from the molding environment to easily adhere. Furthermore, fine metal powder generated from a heat gun used during the secondary processing may also become a cause of particles.

When particles derived from a fluororesin material, among particle generation-causing substances, adhere to a fluororesin molded article, the particles and the fluororesin molded article are strongly bound to each other via hydrophobic interactions, such that the particles cannot be readily removed by cleaning with water. Thus, there has been proposed a method of cleaning with a fluorine-based solvent, which has an affinity for the particles derived from a fluororesin material. However, the use of a fluorine-based solvent requires environmental considerations, and also imposes a considerable economic burden.

A method of the present disclosure is a method for producing a cleaned fluororesin molded article, the method including cleaning a fluororesin molded article with a chemical solution; and cleaning the fluororesin molded article with water. According to the method of the present disclosure, a fluororesin molded article that is less likely to generate particles can be produced economically in a short time, using a relatively small amount of a chemical solution and water. Moreover, because the method of the present disclosure can be used for a fluororesin molded article obtained by secondary processing, it can produce a fluororesin molded article from which particles adhered during the secondary processing have been removed. Furthermore, the method of the present disclosure can reduce the amount of discharge liquid and the amount of discharge water, and additionally, does not require the use of a fluorine-based solvent as a chemical solution.

In the method of the present disclosure, the order of performing the cleaning with a chemical solution and the cleaning with water is not limited, and the number of times that each step is performed is also not limited. For example, the cleaning with a chemical solution may precede the cleaning with water, or the cleaning with water may precede the cleaning with a chemical solution.

The chemical solution to be used in the cleaning with a chemical solution is not limited as long as it is a liquid other than water, and may, for example, be a liquid chemical or a solution containing a chemical. However, for the reason set forth below, it is preferred to use a specific chemical solution, because this can produce a fluororesin molded article in which the generation of particles is further prevented.

Based on the present inventors' findings, particles from a fluororesin molded article include particles of inorganic substances and particles of organic substances. Therefore, in order to prevent the generation of particles from a fluororesin molded article, it is required to remove both inorganic substances and organic substances adhered to the surface of the fluororesin molded article.

Inorganic substances include metal oxides, non-metal oxides, or salts. These substances are removed from the surface of the fluororesin molded article, typically by performing the cleaning with water.

On the other hand, organic substances include components derived from a plasticizer present in the molding atmosphere of the fluororesin, carbons floating in air, and particles derived from a fluororesin material. Of these substances, particularly, particles derived from a fluororesin material (fluorine-based particles) are difficult to remove in the cleaning with water, and are preferably removed by the cleaning with a chemical solution. As used herein, "fluorine-based particles" refer to particles containing carbon and fluorine atoms.

Thus, in the cleaning with a chemical solution in the method of the present disclosure, it is preferred to use a chemical solution capable of readily removing fluorine-based particles that are characteristic of a fluororesin molded article, and are difficult to clean with water.

Therefore, the chemical solution to be used in the cleaning with a chemical solution is preferably a chemical solution that easily wets fluorine-based particles, and is, for example, a non-fluorine-based solvent or a fluorine-based solvent. The use of a fluorine-based solvent can remove fluorine-based particles from the surface of the fluororesin molded article by dissolving them. However, according to the method of the present disclosure, it is not essential to remove fluorine-based particles by dissolving them, and therefore, a non-fluorine-based solvent, which imposes a less economic burden, and is easy to handle, can be suitably used.

The chemical solution to be used in the cleaning with a chemical solution is preferably a liquid chemical having a relatively low surface tension or an aqueous solution containing a chemical having a relatively low surface tension, because this readily wets fluorine-based particles, and can produce a fluororesin molded article in which the generation of particles is further prevented. The surface tension of the liquid chemical or the chemical contained in the aqueous solution is preferably 28 mN/m or less, and more preferably 24 mN/m or less, while the lower limit may be 20 mN/m or more although not limited thereto, because this can produce a fluororesin molded article in which the generation of particles is further prevented.

The chemical solution is preferably an alcohol or aqueous alcohol solution, more preferably a $C_{1-10}$ alcohol or an aqueous solution thereof, still more preferably a $C_{1-4}$ alcohol or an aqueous solution thereof, and particularly preferably methanol, ethanol, isopropyl alcohol, or an aqueous solution thereof, because this can produce a fluororesin molded article in which the generation of particles is further prevented. The chemical solution is most preferably isopropyl alcohol or an aqueous solution thereof, because of its high cleaning ability and high volatility.

The alcohol concentration of the alcohol and the aqueous alcohol solution is preferably 20% by mass or more, more preferably 25% by mass or more, still more preferably 30% by mass or more, and particularly preferably 40% by mass or more, while it is preferably 100% by mass or less, because this can produce a fluororesin molded article in which the generation of particles is further prevented. From the viewpoint of safety and economy, the alcohol concentration may be 80% by mass or less, or may be 60% by mass or less. The present inventors have experimentally obtained the finding that the use of an aqueous alcohol solution whose alcohol concentration is preferably 20 to 80% by mass, more preferably 25 to 60% by mass, still more preferably 30 to 60% by mass, and particularly preferably 40 to 60% by mass can improve the economy and safety during the cleaning, and simultaneously, can produce a fluororesin molded article in which the generation of particles is further prevented.

The chemical solution to be used in the cleaning with a chemical solution is also preferably an alkaline aqueous solution at pH 8 or more, because this allows fluorine-based particles to be readily dispersed in the chemical solution, and can produce a fluororesin molded article in which the generation of particles is further prevented. Alternatively, an aqueous ammonia solution may be used, and the aqueous ammonia solution is also preferably at pH 8 or more. It is assumed that the use of an alkaline aqueous solution or aqueous ammonia solution can appropriately adjust the zeta potential of fluorine-based particles to allow the fluorine-based particles to be stably dispersed in the chemical solution.

The chemical solution to be used in the cleaning of the fluororesin molded article with a chemical solution is preferably a chemical solution from which particles have been removed, and may, for example, be a chemical solution in which the number of particles having sizes of 30 nm φ or more is 30/ml or less.

The chemical solution to be used in the cleaning of the fluororesin molded article with a chemical solution is also preferably a chemical solution from which metal components have been removed. The metal content in the chemical solution, in terms of total metal content of Fe, Cr, Ni, Cu, Al, Na, Mg, and K, is preferably 10 ppb or less, and more preferably 5 ppb or less.

In the cleaning of the fluororesin molded article with a chemical solution, the fluororesin molded article is preferably cleaned with a liquid flow (liquid-flow cleaning), because this can produce a fluororesin molded article in which the generation of particles is further prevented. If the fluororesin molded article is cleaned by immersing it in a stored liquid (stored-liquid cleaning), a fluororesin molded article in which the generation of particles is sufficiently prevented may not be produced. By using a liquid flow in the cleaning, particles can be more readily cleaned away, even if a chemical solution simply for dispersing the particles is used, rather than a chemical solution for dissolving the particles, such as a fluorine-based solvent.

Examples of methods of cleaning with a liquid flow include a method in which the chemical solution is sprayed to the fluororesin molded article with a shower or the like; a method in which the fluororesin molded article is immersed in a cleaning tank in which the chemical solution is flowed at a desired flow rate; and a method in which, when the fluororesin molded article is a molded article having a flow path, such as a tube, the chemical solution is flowed through the flow path.

When a fluororesin molded article having a flow path, such as a tube, is subjected to the liquid-flow cleaning, the flow rate of the chemical solution is preferably 50 to 200 ml/min, and more preferably 100 to 150 ml/min, because this can produce a fluororesin molded article in which the generation of particles is further prevented, and simultaneously, can prevent charging of the fluororesin molded article. In particular, for a tube having an inner diameter of 4 mm, it is preferred to set the flow rate of the chemical solution in the above-described range, and for a tube having an inner diameter greater than 4 mm, the flow rate may be higher, as long as the charging is prevented.

The water to be used in the cleaning of the fluororesin molded article with water is preferably water from which particles have been removed, and may, for example, be water in which the number of particles having sizes of 30 nm (p or more is 30/ml or less.

The water to be used in the cleaning of the fluororesin molded article with water is also preferably water from which metal components have been removed. The metal content in the water, in terms of total metal content of Fe, Cr, Ni, Cu, Al, Na, Mg, and K, is preferably 10 ppb or less, and more preferably 5 ppb or less.

The water to be used in the cleaning of the fluororesin molded article with water is more preferably water from which particles and metal components have been removed, and may, for example, be ultrapure water.

In the cleaning of the fluororesin molded article with water, the fluororesin molded article is preferably cleaned with a water flow (water-flow cleaning), because this can produce a fluororesin molded article in which the generation of particles is further prevented. If the fluororesin molded article is cleaned by immersing it in stored water (stored-water cleaning), a fluororesin molded article in which the generation of particles is sufficiently prevented may not be produced. Examples of methods of cleaning with a water flow include a method in which the water is sprayed to the fluororesin molded article with a shower or the like; a method in which the fluororesin molded article is immersed in a cleaning tank in which the water is flowed at a desired flow rate; and a method in which, when the fluororesin molded article is a molded article having a flow path, such as a tube, the water is flowed through the flow path.

When a fluororesin molded article having a flow path, such as a tube, is subjected to the water-flow cleaning, the flow rate of the water is preferably 50 to 200 ml/min, and more preferably 100 to 150 ml/min, because this can produce a fluororesin molded article in which the generation of particles is further prevented, and simultaneously, can prevent charging of the fluororesin molded article. In particular, for a tube having an inner diameter of 4 mm, it is preferred to set the flow rate of the chemical solution in the above-described range, and for a tube having an inner diameter greater than 4 mm, the flow rate may be higher, as long as the charging is prevented.

The method of the present disclosure may include drying the cleaned fluororesin molded article after the completion of the cleaning with a chemical solution and the cleaning with water. The drying method is not limited, and, for example, may be natural drying, or may be a method such as spin drying, air-blow drying, or suction drying. A preferred drying method of the above is air-blow drying, which blows off droplets with clean air, because this method completes the drying in a short time, and can also prevent contamination due to drying.

The fluororesin molded article to be used in the method of the present disclosure contains a fluororesin. "Fluororesin" refers to a partially crystalline fluoropolymer, and is a fluoroplastic, not a fluoroelastomer. The fluororesin has a melting point and thermoplasticity.

The fluororesin contained in the fluororesin molded article may be either a non melt-processible fluororesin or a melt-fabricable fluororesin, but is preferably a melt-fabricable fluororesin. As used herein, "melt-fabricable" means that a polymer can be melted and processed using a conventional processing device, such as an extruder or an injection molding machine.

Examples of the fluororesin contained in the fluororesin molded article include a fluororesin containing a fluoromonomer unit; and a fluororesin containing a fluoromonomer unit and a non-fluorine-containing monomer unit.

The fluoromonomer is preferably at least one selected from the group consisting of tetrafluoroethylene [TFE], hexafluoropropylene [HFP], chlorotrifluoroethylene

[CTFE], vinyl fluoride [VF], vinylidene fluoride [VDF], trifluoroethylene, hexafluoroisobutylene, a fluoroalkylethylene represented by $CH_2=CZ^1(CF_2)_nZ^2$, wherein $Z^1$ is H or F, $Z^2$ is H, F, or Cl, and n is an integer from 1 to 10, a perfluoro(alkyl vinyl ether) [PAVE] represented by $CF_2=CF—ORf^6$, wherein $Rf^6$ represents a $C_{1-8}$ perfluoroalkyl group, an alkyl perfluorovinyl ether derivative represented by $CF_2=CF—O—CH_2—Rf^7$, wherein $Rf^7$ is a $C_{1-5}$ perfluoroalkyl group, perfluoro-2,2-dimethyl-1,3-dioxole [PDD], and perfluoro-2-methylene-4-methyl-1,3-dioxolane [PMD].

Examples of the fluoroalkylethylene represented by $CH_2=CZ^1(CF_2)_nZ^2$ include $CH_2=CFCF_3$, $CH_2=CH—C_4F_9$, $CH_2=CH—C_6F_{13}$, and $CH_2=CF—C_3F_6H$.

Examples of the perfluoro (alkyl vinyl ether) represented by $CF_2=CF—ORf^6$ include $CF_2=CF—OCF_3$, $CF_2=CF—OCF_2CF_3$, and $CF_2=CF—OCF_2CF_2CF_3$.

Examples of the above-described non-fluorine-containing monomer include a hydrocarbon-based monomer reactive with the above-described fluoromonomer. Examples of the hydrocarbon-based monomer include alkenes, such as ethylene, propylene, butylene, and isobutylene; alkyl vinyl ethers, such as ethyl vinyl ether, propyl vinyl ether, butyl vinyl ether, isobutyl vinyl ether, and cyclohexyl vinyl ether; vinyl esters, such as vinyl acetate, vinyl propionate, vinyl n-butyrate; vinyl isobutyrate, vinyl valerate, vinyl pivalate, vinyl caproate, vinyl caprylate, vinyl caprate, vinyl versatate, vinyl laurate, vinyl myristate, vinyl palmitate, vinyl stearate, vinyl benzoate, vinyl para-t-butylbenzoate, vinyl cyclohexanecarboxylate, vinyl monochloroacetate, vinyl adipate, vinyl acrylate, vinyl methacrylate, vinyl crotonate, vinyl sorbate, vinyl cinnamate, vinyl undecylenate, vinyl hydroxyacetate, vinyl hydroxypropionate, vinyl hydroxybutyrate, vinyl hydroxyvalerate, vinyl hydroxyisobutyrate, and vinyl hydroxycyclohexanecarboxylate; alkyl allyl ethers, such as ethyl allyl ether, propyl allyl ether, butyl allyl ether, isobutyl allyl ether, and cyclohexyl allyl ether; and alkyl allyl esters, such as ethyl allyl esters, propyl allyl esters, butyl allyl esters, isobutyl allyl esters, and cyclohexyl allyl esters.

The non-fluorine-containing monomer may also be, for example, a hydrocarbon-based monomer containing a functional group. Examples of the hydrocarbon-based monomer containing a functional group include hydroxyalkyl vinyl ethers, such as hydroxyethyl vinyl ether, hydroxypropyl vinyl ether, hydroxybutyl vinyl ether, hydroxyisobutyl vinyl ether, and hydroxycyclohexyl vinyl ether; non-fluorine-containing monomers having glycidyl groups, such as glycidyl vinyl ether and glycidyl allyl ether; non-fluorine-containing monomers having amino groups, such as aminoalkyl vinyl ethers and aminoalkyl allyl ethers; non-fluorine-containing monomers having amide groups, such as (meth)acrylamide and methylolacrylamide; bromine-containing olefins, iodine-containing olefins, bromine-containing vinyl ethers, and iodine-containing vinyl ethers; and non-fluorine-containing monomers having nitrile groups.

A preferred combination of the fluoromonomer unit and the non-fluorine-containing monomer unit is, for example, a combination of a tetrafluoroethylene unit with at least one monomer unit selected from the group consisting of a hexafluoropropylene unit, a fluoroalkylethylene unit, a perfluoro(alkyl vinyl ether) unit, and an ethylene unit.

More specifically, the above-described fluororesin is preferably at least one fluororesin selected from the group consisting of polytetrafluoroethylene [PTFE], TFE/PAVE copolymer [PFA], TFE/HFP copolymer [FEP], ethylene [Et]/TFE copolymer [ETFE], Et/TFE/HFP copolymer, poly-chlorotrifluoroethylene [PCTFE], CTFE/TFE copolymer, Et/CTFE copolymer, PVDF, VDF/TFE copolymer, and polyvinyl fluoride (PVF). The fluororesin is more preferably at least one selected from the group consisting of PFA, FEP, ETFE, and Et/TFE/HFP copolymer, and still more preferably at least one perfluororesin selected from the group consisting of PFA and FEP.

When the fluororesin is melt-fabricable, the melt flow rate (MFR) of the fluororesin can be measured using the measurement method described below. The MFR of the fluororesin is preferably 1 to 100 g/10 min, more preferably 1 to 50 g/10 min, and particularly preferably 2 to 30 g/10 min, from the viewpoint of the mechanical strength and ease of production of the fluororesin molded article.

As used herein, the MFR is the value obtained using a melt indexer (manufactured by Yasuda Seiki Company) in accordance with ASTM D1238, as the mass (g/10 min) of the polymer that flows out of a nozzle with an inner diameter of 2 mm and a length of 8 mm per 10 minutes, under a measurement temperature (for example, 372° C. for PFA or FEP, and 297° C. for ETFE) and a load (for example, 5 kg for PFA, FEP, and ETFE) determined according to the type of the fluoropolymer.

The melting point of the fluororesin is preferably 190 to 340° C., more preferably 200° C. or more, still more preferably 220° C. or more, and particularly preferably 280° C. or more, while it is more preferably 324° C. or less, and more preferably 322° C. or less. The melting point is the temperature that corresponds to the maximum value on a heat-of-fusion curve upon heating at a rate of 10° C./min using a differential scanning calorimeter [DSC].

The PFA is preferably a copolymer having a molar ratio of the TFE unit to the PAVE unit (TFE unit/PAVE unit) of 70/30 or more and less than 99/1, although not limited thereto. The molar ratio is more preferably 70/30 or more and 98.9/1.1 or less, and still more preferably 80/20 or more and 98.9/1.1 or less. If the amount of the TEE unit is excessively small, the mechanical property tends to be reduced, whereas if the amount is excessively large, the melting point tends to be excessively high, resulting in reduced moldability. The PFA is also preferably a copolymer containing 0.1 to 10 mol % of a monomer unit derived from a monomer copolymerizable with TFE and PAVE, and containing 90 to 99.9 mol % in total of the TFE unit and the PAVE unit. Examples of the monomer copolymerizable with TFE and PAVE include HFP, a vinyl monomer represented by $CZ^3Z^4=CZ^5(CF_2)_nZ^6$, wherein $Z^3$, $Z^4$, and $Z^5$ are the same or different, and each represent H or F, $Z^6$ represents H, F, or Cl, and n is an integer from 2 to 10, and an alkyl perfluorovinyl ether derivative represented by $CF_2=CF—OCH_2—Rf^7$, wherein $Rf^7$ represents a $C_{1-5}$ perfluoroalkyl group.

The melting point of the PFA is preferably 180 to 324° C., more preferably 230 to 320° C., and still more preferably 280 to 320° C.

The melt flow rate (MFR) of the PFA measured at 372° C. is preferably 1 to 100 g/10 min, more preferably 1 to 50 g/10 min, and particularly preferably 2 to 30 g/10 min.

The PFA preferably has an initial pyrolysis temperature of 380° C. or more. The initial pyrolysis temperature is more preferably 400° C. or more, and still more preferably 410° C. or more.

The FEP is preferably a copolymer having a molar ratio of the TFE unit to the HFP unit (TFE unit/HFP unit) of 70/30 or more and less than 99/1, although not limited thereto. The molar ratio is more preferably 70/30 or more and 98.9/1.1 or less, and still more preferably 80/20 or more and 98.9/1.1 or less. If the amount of the TFE unit is excessively small, the mechanical property tends to be reduced, whereas if the amount is excessively large, the melting point tends to be excessively high, resulting in reduced moldability. The FEP is also preferably a copolymer containing 0.1 to 10 mol % of a monomer unit derived from a monomer copolymerizable with TFE and HFP, and containing 90 to 99.9 mol % in total of the TFE unit and the HFP unit. Examples of the monomer copolymerizable with TFE and HFP include PAVE and the alkyl perfluorovinyl ether derivative.

The melting point of the FEP is preferably 150 to 324° C., more preferably 200 to 320° C., and still more preferably 240 to 320° C.

The melt flow rate (MFR) of the FEP measured at 372° C. is preferably 1 to 100 g/10 min, more preferably 1 to 50 g/10 min, and particularly preferably 2 to 30 g/10 min.

The FEP preferably has an initial pyrolysis temperature of 360° C. or more. The initial pyrolysis temperature is more preferably 380° C. or more, and still more preferably 390° C. or more.

The ETFE is preferably a copolymer having a molar ratio of the TFE unit to the ethylene unit (TFE unit/ethylene unit) of 20/80 or more and 90/10 or less. The molar ratio is more preferably 37/63 or more and 85/15 or less, and still more preferably 38/62 or more and 80/20 or less. The ETFE may, for example, be a copolymer composed of TFE, ethylene, and a monomer copolymerizable with TFE and ethylene. Examples of the copolymerizable monomer include monomers represented by the following formulae: $CH_2=CX^5Rf^3$, $CF_2=CFRf^3$, $CF_2=CEORf^3$, and $CH_2=C(Rf^3)_2$, wherein $X^5$ represents H or F, and $Rf^3$ represents a fluoroalkyl group optionally containing an ether linkage. Of the above, preferred are fluorine-containing vinyl monomers represented by $CF_2=CFRf^3$, $CF_2-CFORf^3$, and $CH_2=CX^5Rf^3$; and more preferred are HFP, a perfluoro (alkyl vinyl ether) represented by $CF_2=CF-ORf^4$, wherein $Rf^4$ represents a $C_{1-5}$ perfluoroalkyl group, and a fluorine-containing vinyl monomer represented by $CH_2=CX^5Rf^3$, wherein $Rf^3$ is a $C_{1-8}$ fluoroalkyl group. The monomer copolymerizable with TFE and ethylene may also be, for example, an aliphatic unsaturated carboxylic acid, such as itaconic acid or itaconic anhydride. The ETFE preferably contains 0.1 to 10 mol %, more preferably contains 0.1 to 5 mol %, and particularly preferably contains 0.2 to 4 mol %, of the monomer unit copolymerizable with TFE and ethylene.

The melting point of the ETFE is preferably 140° C. to less than 324° C., more preferably 160 to 320° C., and still more preferably 195 to 320° C.

The melt flow rate (MFR) of the ETFE measured at 297° C. is preferably 1 to 100 g/10 min, more preferably 1 to 50 g/10 min, and particularly preferably 2 to 30 g/10 min.

The ETFE preferably has an initial pyrolysis temperature of 330° C. or more. The initial pyrolysis temperature is more preferably 340° C. or more, and still more preferably 350° C. or more.

The fluororesin may be a fluororesin having an end group, such as $-CF_3$ or $-CF_2H$, in at least one region of the polymer main chain and a polymer side chain, and is preferably a fluororesin that has been subjected to a fluorination treatment, although not limited thereto. A fluororesin that has not been subjected to a fluorination treatment sometimes has end groups unstable in terms of thermal and electrical properties (hereinafter, such end groups are also referred to as "unstable end groups"), such as $-COOH$, $-COOCH_3$, $-CH_2OH$, $-COF$, and $-CONH_2$. The fluorination treatment can reduce such unstable end groups.

The fluororesin preferably contains no unstable end groups, or contains only a small number of unstable end groups. Preferably, the total number of unstable end groups in the fluororesin is 120 or less per $1\times10^6$ carbons.

In the fluororesin, the number of a total of the above-described five types of unstable end groups and $-CF_2H$ end groups, i.e., the total number of $-COOH$, $-COOCH_3$, $-CH_2OH$, $-COF$, $-CONH_2$, and $-CF_2H$, is more preferably 120 or less per $1\times10^6$ carbons, because this can prevent a molding defect due to foaming during molding. If the number exceeds 120, a molding defect may occur. The number of unstable end groups is more preferably 50 or less, still more preferably 20 or less, and most preferably 10 or less. As used herein, the number of unstable end groups is the value obtained by infrared absorption spectrum measurement. The end groups of the fluororesin may all be $-CF_3$ end groups, without the unstable end groups and $-CF_2H$ end groups. Infrared spectroscopy can be used to identify the type of functional groups and measure the number of functional groups.

The fluorination treatment can be performed by contacting the fluororesin before the fluorination treatment with a fluorine-containing compound.

Examples of the fluorine-containing compound include, but are not limited to, a fluorine radical source that generates fluorine radicals under fluorination treatment conditions. Examples of the fluorine radical source include $F_2$ gas, $CoF_3$, $AgF_2$, $UF_6$, $OF_2$, $N_2F_2$, $CF_3OF$, and halogen fluorides (such as $IF_5$ and $ClF_3$).

The fluorine radical source, such as $F_2$ gas, may have, for example, a concentration of 100%; however, from a safety viewpoint, the fluorine radical source is preferably mixed with an inert gas and diluted to 5 to 50% by mass before use, and is more preferably diluted to 15 to 30% by mass before use. Examples of the inert gas include nitrogen gas, helium gas, and argon gas. From an economical viewpoint, nitrogen gas is preferred.

The conditions for the fluorination treatment are not limited; for example, the fluororesin in a molten state and the fluorine-containing compound may be contacted usually at a temperature not higher than the melting point of the fluororesin, preferably at 20 to 220° C., more preferably at 100 to 200° C. The fluorination treatment is typically performed for 1 to 30 hours, preferably for 5 to 25 hours. The fluorination treatment is preferably performed by contacting the fluororesin before the fluorination treatment with a fluorine gas ($F_2$ gas).

The fluororesin molded article may optionally contain other components. Examples of the other components include additives, such as a cross-linking agent, an antistatic agent, a heat-resistant stabilizer, a foaming agent, a foaming nucleating agent, an antioxidant, a surfactant, a photopolymerization initiator, an antiwear agent, and a surface modifier.

The fluororesin contained in the fluororesin molded article can be produced by block polymerization, solution polymerization, emulsion polymerization, suspension polymerization, or the like.

The fluororesin molded article can be obtained by molding the fluororesin obtained by the polymerization. Examples of methods of molding the fluororesin include, but are not limited to, known methods, such as extrusion, injection molding, transfer molding, inflation molding, and compression molding. Any of these molding methods may be selected appropriately according to the shape of the molded article to be obtained. By using the method of the present disclosure, a fluororesin molded article that is less likely to generate particles can be produced in a short time, even in the case of using a fluororesin molded article molded by a melt molding method, such as extrusion or injection molding, and to which fluorine-based particles generated during melt molding adhere.

According to the method of the present disclosure, for example, even in the case of using, as a fluororesin molded article to be cleaned, a fluororesin molded article that when contacted with isopropyl alcohol, causes above 700/ml of particles having sizes of 30 nm 9 or more to be dispersed in the isopropyl alcohol, a cleaned fluororesin molded article in which the number of particles having sizes of 30 nm φ or more dispersed in the isopropyl alcohol is 700/ml or less can be produced. In the method of the present disclosure, the number of particles in the fluororesin molded article to be cleaned may be above 400/ml, and the number of particles in the cleaned fluororesin molded article may be 400/ml or less.

The method of the present disclosure preferably further includes removing particles from the chemical solution used in the cleaning; and reusing the chemical solution from which the particles have been removed as at least part of the chemical solution to be used in the cleaning with a chemical solution. The reusing of the chemical solution can cut down costs, and simultaneously, can cut down the amount of discharge liquid, thereby reducing the environmental burden.

The chemical solution used in the cleaning contains the particles removed from the fluororesin molded article. Examples of means for removing the particles from the chemical solution include, but are not limited to, a filter. The particles can be readily removed from the chemical solution by passing the chemical solution through a filter. The removing of particles from the chemical solution preferably reduces the number of particles having sizes of 30 nm φ or more in the chemical solution to 30/ml or less.

The chemical solution from which the particles have been removed can be used as at least part of or all of the chemical solution to be used in the cleaning with a chemical solution.

The method of the present disclosure preferably further includes removing particles from the water used in the cleaning; and reusing the water from which the particles have been removed as at least part of the water to be used in the cleaning with water. The reusing of the water can cut down costs, and simultaneously, can cut down the amount of discharge water, thereby reducing the environmental burden.

The water used in the cleaning contains the particles removed from the fluororesin molded article. Examples of means for removing the particles from the water include, but are not limited to, a filter. The particles can be readily removed from the water by passing the water through a filter. The removing of particles from the water preferably reduces the number of particles having sizes of 30 nm φ or more in the water to 30/ml or less.

The water from which the particles have been removed can be used as at least part of the water to be used in the cleaning with water.

Next, with reference to the drawings, a system for carrying out the method of the present disclosure will be described. FIG. 1 is a schematic diagram showing one exemplary embodiment of a system of the present disclosure. As shown in FIG. 1, a system 1 according to one embodiment of the present disclosure includes a filter 11, i.e., first filtration means, a filter 21, i.e., second filtration means, a chemical solution container 12, a water container 22, a switching valve 31, i.e., switching means, and connection piping 32 for a member to be cleaned, i.e., cleaning means.

In the system 1, an outlet of the chemical solution container 12 is connected via a pump 13 to an inlet of the filter 11 through a pipe. A chemical solution stored in the chemical solution container 12 is supplied by the pump 13 to the filter 11, and passes through the filter 11, whereby particles in the chemical solution are removed. An outlet of the water container 22 is connected via a pump 23 to an inlet of the filter 21 through a pipe. Water stored in the water container 22 is supplied by the pump 23 to the filter 21, and passes through the filter 21, whereby particles in the water are removed. In this manner, because the system 1 includes the filter through which the chemical solution or water is passed, the particles can be removed from the chemical solution or water, and a fluororesin molded article that is less likely to generate particles can be efficiently produced even when the reused chemical solution or water is used.

An outlet of the filter 11 is connected to the switching valve 31 through a pipe. An outlet of the filter 21 is connected to the switching valve 31 through a pipe. In this manner, the switching valve 31 is configured to be capable of switching between the chemical solution supplied from the filter 11 and the water supplied from the filter 21, and is also connected to an inlet of the connection piping 32 for a member to be cleaned through a pipe, to be capable of supplying the chemical solution or water to the connection piping 32 for a member to be cleaned. In this manner, because the system 1 includes the switching means for switching between the chemical solution and the water supplied from the two systems of supply means, it can smoothly switch between the cleaning with the chemical solution and the cleaning with the water, and can efficiently produce a fluororesin molded article that is less likely to generate particles.

An outlet of the connection piping 32 for a member to be cleaned is connected via a valve 14 to an inlet of the chemical solution container 12 through a pipe, and is also connected via a valve 24 to an inlet of the water container 22 through a pipe. In this manner, the valves 14 and 24 are configured to be capable of switching between discharge liquid from the connection piping 32 for a member to be cleaned and discharge water from the connection piping 32 for a member to be cleaned, and are each connected to the respective container through a pipe to be capable of returning the discharge liquid to the chemical solution container 12 or returning the discharge water to the water container 22. In this manner, because the system 1 includes first returning means for returning the chemical solution used in the cleaning from the cleaning means to the first filtration means, and second returning means for returning the water used in the cleaning from the cleaning means to the second filtration means, the chemical solution and the water can be reused without being mixed into each other.

The outlet of the connection piping 32 for a member to be cleaned is also configured such that the discharge liquid and the discharge water used in the connection piping 32 for a member to be cleaned can be discharged out of the system via a valve 41 through a pipe. Therefore, when the discharge liquid or the discharge water contains an extremely large number of particles, or is contaminated with substances other than particles, it can be discharged out of the system via the valve 41 through a discharge pipe. When the discharge liquid or the discharge water is discharged out of the system, fresh chemical solution or water may be introduced into the chemical solution container 12 or the water container 22.

In the connection piping 32 for a member to be cleaned, a fluororesin molded article is cleaned with the chemical solution or cleaned with the water. The connection piping 32 for a member to be cleaned can be configured according to the shape of the fluororesin molded article. FIG. 1 shows a case where the fluororesin molded article is a tube. One end of the tube serving as an inlet is connected to the switching valve 31 through a pipe, while the other end of the tube serving as an outlet is connected to the valves 14, 24, and 41 through pipes. In this case, a plurality of tubes may be connected such that they can be cleaned simultaneously. Alternatively, a plurality of fluororesin molded articles (pipe members) of different shapes, such as tubes, joints, bent tubes, and welded tube members, may be connected such that the fluororesin molded articles of different shapes can be cleaned simultaneously. The connection between the fluororesin molded article and the pipes or the connection between the plurality of fluororesin molded articles can be provided using connection members, such as joints (not shown). Such a connection member is preferably a connection member made of a fluororesin, such as PFA. The plurality of fluororesin molded articles may be connected in series or in parallel.

In the connection piping 32 for a member to be cleaned, the fluororesin molded article is preferably subjected to liquid-flow cleaning or water-flow cleaning, while the chemical solution or the water is being flowed at a desired rate, in order to improve the cleaning efficiency. Furthermore, in the connection piping 32 for a member to be cleaned, the fluororesin molded article may be heated, or ultrasonic waves may be applied to the chemical solution or the water.

While the cleaning means (connection piping 32 for a member to be cleaned) in the system 1 is configured to be suitable for cleaning a tube or a joint having a flow path through which a liquid is transferred, it may also be configured to be suitable for cleaning a sealing member or a diaphragm portion of a diaphragm pump. For example, the cleaning means (connection piping 32 for a member to be cleaned) may include a cleaning tank in which the fluororesin molded article can be immersed in the chemical solution or the water, or may include a nozzle for discharging the chemical solution or the water such that the chemical solution or the water can be sprayed to the fluororesin molded article. The cleaning means (connection piping 32 for a member to be cleaned) may also include a cleaning chamber to prevent splashing of the chemical solution or the water.

The chemical solution and the water used in the connection piping 32 for a member to be cleaned each pass through separate pipes via the valve 14 and the valve 24 to be returned to the chemical solution container 12 and the water container 22, respectively. The returned chemical solution and water may be reused immediately, or may be reused after being stored for a certain period of time. In this manner, because the system 1 performs cleaning of the fluororesin molded article while the chemical solution and the water are being transferred in separate systems, it can produce a fluororesin molded article that is less likely to generate particles in a short time, and simultaneously, can reduce the amount of discharge liquid and the amount of discharge water.

Examples of the fluororesin molded article used in the method of the present disclosure or the system of the present disclosure include, but are not limited to, a pellet, a film, a sheet, a plate, a rod, a block, a cylinder, a container, an electric wire, a tube, a bottle, a joint, a bag, and a wafer carrier. The fluororesin molded article is preferably a pipe member, such as a tube, a joint, a bent tube, or a welded tube member, and is more preferably a tube.

The outer diameter of the tube may be 2 to 100 mm, or may be 5 to 50 mm, although not limited thereto. The thickness of the tube may be 0.1 to 10 mm, or may be 0.3 to 5 mm.

Examples of the fluororesin molded article also include the following:

a diaphragm portion of a diaphragm pump, a bellows molded article, an electric wire coating, a semiconductor part, a packing seal, a thin-walled tube for a copy roll, a monofilament, a belt, a gasket, an optical lens part, a tube for petroleum mining, a tube for geothermal power generation, an electric wire for petroleum mining, an electric wire for a satellite, an electric wire for nuclear power generation, an electric wire for an airplane, a solar cell panel film, a gasket for a secondary battery or an electric double layer capacitor, an OA roll, and the like;

a tube through which a gas or chemical solution is transferred, a bottle for storing a chemical, a gas bag, a chemical solution bag, a chemical solution container, a bag for frozen storage, and the like; and the body or parts of an opening/closing valve, sleeves used for connecting joints and tubes, screw caps for chemical solution bottles and containers, articles in which substrates are coated with fluororesins, such as gears, screws, a frying pan, a pot, a jar rice cooker, and a metal, a release film, and the like.

Particularly suitable uses of the fluororesin molded article produced by the method of the present disclosure or the system of the present disclosure are fluororesin members for a semiconductor manufacturing apparatus, such as a pipe for chemical solution supply equipment for semiconductor manufacturing, tubes, joints, a valve, a tank, a container, a chemical solution bag, a wafer carrier, and a pump.

The tube produced by the method of the present disclosure or the system of the present disclosure is almost free of particles adhered to the inner surface, and is less likely to generate particles, and thus, can be suitably used as a tube for a chemical solution pipe through which a chemical solution is transferred. Examples of the chemical solution include chemical solutions used for semiconductor manufacturing, for example, chemical solutions such as aqueous ammonia, ozone water, hydrogen peroxide solution, hydrochloric acid, sulfuric acid, a resist liquid, a thinner liquid, and a developing liquid.

The fluororesin molded article produced by the method of the present disclosure or the system of the present disclosure can also be used as, for example, a member installed in an apparatus for performing a front-end-of-line step for semiconductors. Examples of such front-end-of-line steps for semiconductors include the following steps:

a. "cleaning step" of cleaning a silicon wafer as a substrate;
b. "film formation step" of forming a thin film as a circuit material on the silicon wafer;
c. "resist application step" of uniformly applying a photoresist (sensitizing liquid);
d. "exposure step" of transferring the circuit pattern;
e. "development step" of dissolving the photoresist on the exposed region;

f. "etching step" of removing the underlying thin film exposed by a chemical solution or ions;

g. "ion implantation step" of implanting an impurity, such as phosphorus, to impart electrical properties to silicon; and h. "stripping step" of removing unwanted photoresist.

Chemical solutions used in these steps vary widely in type, such as acids, alkalis, and organic solvents. A chemical solution to be used is transferred by chemical solution supply equipment from the tank to a use point, during which time it comes into contact with the inner surfaces of a pipe, tubes, joints, valves, pumps, a filter, and the like. At this time, generally, the chemical solution supply equipment is cleaned in advance with ultrapure water or the chemical solution to be used. A semiconductor manufacturing apparatus or a resist application apparatus called a coater/developer is also cleaned after assembly of the apparatus. However, these cleaning steps may use large amounts of expensive chemical solutions, and may require long hours of cleaning. This also imposes a considerable economic burden.

The method of the present disclosure or the system of the present disclosure can produce a fluororesin molded article that is less likely to generate particles economically in a short time, using a relatively small amount of a chemical solution and water, and thus, can be particularly suitably used for cleaning a member for performing a front-end-of-line step for semiconductors.

While the embodiments have been described above, it will be understood that various changes can be made to the modes or details, without departing from the spirit and scope of the claims.

EXAMPLES

The embodiments of the present disclosure will be described next with reference to Examples, although the present disclosure is not limited solely to the Examples.

Values recited in EXAMPLES were measured by the following methods.

(Melting Point of Copolymer)

A sample was prepared from the tube used in each of the Examples and Comparative Examples, and the melting point was determined as the temperature that corresponds to the maximum value on a heat-of-fusion curve upon heating at a rate of 10° C./min using a differential scanning calorimeter [DSC].

(MFR of Copolymer)

A sample was prepared from the tube used in each of the Examples and Comparative Examples, and the MFR was determined using a melt indexer (manufactured by Yasuda Seiki Company) in accordance with ASTM D1238, as the mass (g/10 min) of the polymer that flowed out of a nozzle with an inner diameter of 2 mm and a length of 8 mm per 10 minutes, under 372° C. and a load of 5 kg.

(Monomer Unit Content in Copolymer)

A sample was prepared from the tube used in each of the Examples and Comparative Examples, and the monomer unit content was measured by the $^{19}$F-NMR method.

(Number of Particles)

(1) Preparation of Isopropyl Alcohol

Commercially available high-purity isopropyl alcohol (IPA) was filtered through a 5-nm-φ filter. The filtered IPA was left standing for 1 day, and the number of particles having sizes of 30 nm φ or more in the filtered IPA was confirmed to be 30/ml or less. The thus-filtered IPA was used in the cleaning of the tube and the measurement of the number of particles.

(2) Measurement of the Number of Particles

Figure 2:
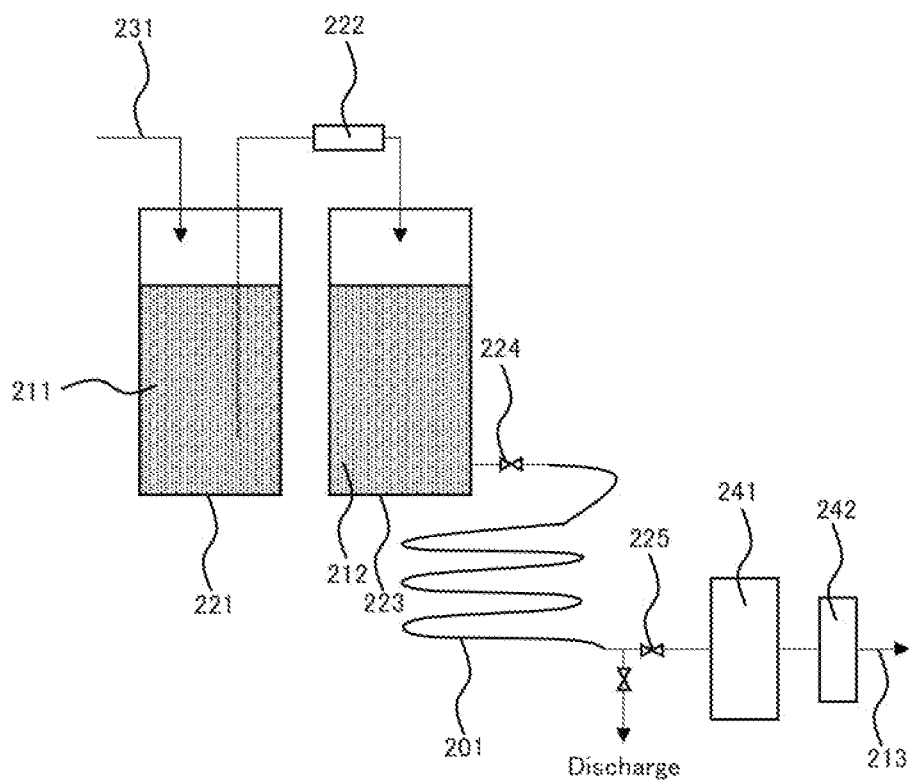
FIG. 2 is a diagram for illustrating a method of measuring the number of particles.

The evaluation tube prepared in each of the Examples and Comparative Examples was connected to a particle counter shown in FIG. 2, and filled with the IPA used for the measurement. Next, the IPA in the tube was introduced with a syringe pump into the particle counter (light scattering-type liquid-borne particle detector KS-19F manufactured by RION Co., Ltd.), and the number of particles was measured.

After a while from the start of the measurement, a maximum number of particles was measured, and thereafter, the number of measured particles tended to gradually decrease. Table 1 shows the maximum value of the number of particles having sizes of 30 nm φ or more observed when the volume of flowed IPA was between 0 L to 0.5 L; the minimum value of the number of particles having sizes of 30 nm φ or more observed when the volume of flowed IPA was between above 0.5 L and a volume equivalent to about 16 times the inner volume of the tube (1.0 L); and the minimum value of the number of particles having sizes of 30 nm φ or more observed when the volume of flowed IPA was between a volume equivalent to above about 16 times the inner volume of the tube (1.0 L) and a volume equivalent to about 24 times the inner volume of the tube (1.5 L).

FIG. 2 is a diagram for illustrating a method of measuring the number of particles.

Initially, nitrogen gas 231 is supplied into a first chemical solution container 221 to pressurize isopropyl alcohol (IPA) 211 stored in the chemical solution container 221. The pressurized IPA 211 passes through a filter 222 to be stored in a second chemical solution container 223. The IPA 212 in the second chemical solution container 223 is used for the measurement after being left standing for 1 day.

A lower region of the second chemical solution container 223 is connected with a valve 224, and an evaluation tube 201 is connected via the valve 224 to the second chemical solution container 223. The other end of the evaluation tube 201 is connected to a particle counter 241 via a valve 225. A syringe pump 242 is also disposed downstream of the particle counter 241 to allow the IPA in the evaluation tube 201 to be introduced into the particle counter 241.

It is required to use diaphragm valves as the valves 224 and 225, in order to avoid the inclusion of particles into the IPA 212 due to opening and closing of the valves 224 and 225 connected to the evaluation tube 201.

Once the system for measuring the number of particles has been thus configured, the IPA 212 is supplied from the second chemical solution container 223 into the evaluation tube 201, and sealed in the evaluation tube 201.

After the sealing of the IPA, the syringe pump 242 is operated to introduce the IPA in the evaluation tube 201 into the particle counter 241. The number of particles is herein measured in this manner.

Comparative Example 1

A tube of a PFA (TFE/perfluoro (propyl vinyl ether) [PPVE] copolymer [TFE/PPVE=96.5/3.5 (% by mass)], MFR: 2.5 g/10 min, melting point: 306° C.) with an outer diameter of 6 mm and an inner diameter of 4 mm (hereinafter referred to as "PFA1") was cut to a length of 5 m to prepare an evaluation tube. This tube was used without being cleaned at all, and the number of particles was measured in accordance with the above-described method. The results are shown in Table 1.

Comparative Example 2

The number of particles was measured as in Comparative Example 1, except that a tube of a PFA (TFE/PPVE copolymer [TFE/PPVE=94.5/5.5 (% by mass)], MFR: 3.2 g/10 min, melting point: 302° C.) with an outer diameter of 6 mm and an inner diameter of 4 mm (hereinafter referred to as "PFA2") was used. The results are shown in Table 1.

Both PFA1 and PFA2 are commercially available tubes. The results of Comparative Examples 1 and 2 demonstrate that a maximum of several tens of thousands of particles/ml are observed from the commercially available PFA tubes. Moreover, because the number of particles is different between Comparative Examples 1 and 2, it is assumed that the degree of contamination varies depending on the type of the tube and the history after molding. Furthermore, even in the measurement after the IPA was flowed in a volume above about 16 times the inner volume, the number of particles from PFA1 was measured as 186/ml, and the number of particles from PFA2 was measured to be significantly above 1,000/ml.

Comparative Example 3

PFA1 with an outer diameter of 6 mm and an inner diameter of 4 mm was cut to a length of 5 m to prepare an evaluation tube. This tube was cleaned by flowing ultrapure water (UPW) therethrough in a volume of about 20 times the inner volume of the tube, and then the number of particles was measured in accordance with the above-described method. The results are shown in Table 1.

Comparative Example 4

The number of particles was measured as in Comparative Example 3, except that PFA2 with an outer diameter of 6 mm and an inner diameter of 4 mm was used. The results are shown in Table 1.

The results of Comparative Examples 3 and 4 demonstrate that also when the tubes are cleaned with ultrapure water, the number of particles is measured as a maximum of several tens of thousands of particles/ml. Furthermore, even in the measurement after the IPA was flowed in a volume above about 16 times the inner volume, the number of particles from PFA1 was measured as 74/ml, and the number of particles from PFA2 was measured to be significantly above 236/ml.

Comparative Example 5

PFA1 with an outer diameter of 6 mm and an inner diameter of 4 mm was cut to a length of 5 m to prepare an evaluation tube. This tube was cleaned by flowing the IPA therethrough in a volume of about 20 times the inner volume of the tube, and then the number of particles was measured in accordance with the above-described method. The results are shown in Table 1.

Comparative Example 6

The number of particles was measured as in Comparative Example 5, except that PFA2 with an outer diameter of 6 mm and an inner diameter of 4 mm was used. The results are shown in Table 1.

The results of Comparative Examples 5 and 6 demonstrate that also when the tubes are cleaned with the IPA, a maximum of above 400 particles/ml are observed. In particular, the number of particles from PFA2 was measured to be significantly above 2,000/ml. Furthermore, even in the measurement after the IPA was flowed in a volume above about 16 times the inner volume, the number of particles from PFA1 was measured as 55/ml, and the number of particles from PFA2 was measured to be significantly above 238/ml.

Example 1

PFA1 with an outer diameter of 6 mm and an inner diameter of 4 mm was cut to a length of 5 m to prepare an evaluation tube. This tube was cleaned by flowing ultrapure water (UPW) therethrough in a volume of about 20 times the inner volume of the tube, followed by flowing an equal volume of the IPA, and then the number of particles was measured in accordance with the above-described method. The results are shown in Table 1.

Example 2

The number of particles was measured as in Example 1, except that PFA2 with an outer diameter of 6 mm and an inner diameter of 4 mm was used. The results are shown in Table 1.

The results of Examples 1 and 2 demonstrate that the number of particles can be markedly reduced by cleaning the tubes with ultrapure water, followed by cleaning with the IPA.

Example 3

PFA1 with an outer diameter of 6 mm and an inner diameter of 4 mm was cut to a length of 5 m to prepare an evaluation tube. This tube was cleaned by flowing the IPA therethrough in a volume of about 20 times the inner volume of the tube, followed by flowing an equal volume of ultrapure water (UPW), and then the number of particles was measured in accordance with the above-described method. The results are shown in Table 1.

Example 4

The number of particles was measured as in Example 3, except that an aqueous IPA solution (IPA concentration: 60% by mass) was used instead of the IPA. The results are shown in Table 1.

Example 5

The number of particles was measured as in Example 3, except that an aqueous IPA solution (IPA concentration: 30% by mass) was used instead of the IPA. The results are shown in Table 1.

The results of Examples 3 to 5 demonstrate that the number of particles can be markedly reduced by cleaning the tubes with the IPA or aqueous IPA solutions, followed by cleaning with water.

TABLE 1

| | | Comparative Example | | | | | | Example | | | | |
|---|---|---|---|---|---|---|---|---|---|---|---|---|
| | | 1 | 2 | 3 | 4 | 5 | 6 | 1 | 2 | 3 | 4 | 5 |
| Tube type | | PFA1 | PFA2 | PFA1 | PFA2 | PFA1 | PFA2 | PFA1 | PFA2 | PFA1 | PFA1 | PFA1 |
| | | Production conditions | | | | | | | | | | |
| First cleaning | | Not cleaned | Not cleaned | Ultrapure water | Ultrapure water | IPA | IPA | Ultrapure | Ultrapure | IPA | Aqueous IPA solution | Aqueous IPA solution |
| Second cleaning | | None | None | None | None | None | None | IPA | IPA | Ultrapure water | Ultrapure water | Ultrapure water |
| | | Number of particles (particle(s)/ml) | | | | | | | | | | |
| Volume of flowed IPA | from 0 L to 0.5 L | 66000 | 78000 | 32000 | 35000 | 416 | 2306 | 52 | 102 | 36 | 145 | 184 |
| | from above 0.5 L to about 16 times the inner volume | 1114 | 5462 | 154 | 714 | 94 | 628 | 30 | 56 | 25 | 74 | 85 |
| | from above about 16 times the inner volume to about 24 times the inner volume | 186 | 1140 | 74 | 236 | 55 | 238 | 20 | 25 | 18 | 28 | 30 |

REFERENCE SIGNS LIST

1: system
11: filter
12: chemical solution container
13: pump
14: valve
21: filter
22: water container
23: pump
24: valve
31: switching valve
32: connection piping for a member to be cleaned
41: valve

The invention claimed is:

1. A method for producing a cleaned fluororesin molded tube, the method comprising:
   cleaning a fluororesin molded tube with a chemical solution; and
   cleaning the fluororesin molded tube with water so as to produce the cleaned fluororesin molded tube, wherein
   the fluororesin molded tube contains a fluororesin which is a fluoropolymer having a melting point of 190 to 340° C. and is a tetrafluoroethylene/perfluoro(propyl vinyl ether) copolymer,
   the tetrafluoroethylene/perfluoro(propyl vinyl ether) copolymer is a copolymer having a molar ratio of a tetrafluoroethylene unit to a perfluoro(propyl vinyl ether) unit of 80/20 to 98.9/1.1 as a molar ratio of "tetrafluoroethylene unit/perfluoro(propyl vinyl ether) unit",
   the tetrafluoroethylene/perfluoro(propyl vinyl ether) copolymer has a melt flow rate (MFR) of 1 to 30 g/10 min,
   the cleaning with water is performed after the cleaning with the chemical solution,
   the chemical solution is an alcohol,
   the alcohol is isopropyl alcohol comprising a number of particles having sizes of 30 nm φ or more is 30/ml or less,
   the water is ultrapure water comprising a number of particles having sizes of 30 nm φ or more is 30/ml or less,
   in the cleaning with the chemical solution, the chemical solution is flowed through a flow path of the fluororesin molded tube at a flow rate of 50 to 200 ml/min with a volume of the chemical solution equivalent to about 20 times an inner volume of the tube, and
   in the cleaning with the ultrapure water, the ultrapure water is flowed through the flow path of the fluororesin molded tube at a flow rate of 50 to 200 ml/min with a volume of the ultrapure water equivalent to about 20 times the inner volume of the tube.

2. The method according to claim 1, further comprising:
   removing the particles from the chemical solution used in the cleaning; and
   reusing the chemical solution from which the particles have been removed as at least part of the chemical solution to be used in the cleaning with the chemical solution for producing another cleaned fluororesin molded tube.

3. The method according to claim 1, further comprising:
   removing the particles from the ultrapure water used in the cleaning; and
   reusing the ultrapure water from which the particles have been removed as at least part of the ultrapure water to be used in the cleaning with the ultrapure water for producing another cleaned fluororesin molded tube.

4. The method according to claim 1, wherein the fluororesin molded tube has an outer diameter of 2 to 100 mm and a thickness of 0.1 to 10 mm.

* * * * *